United States Patent
Yamamoto et al.

(10) Patent No.: US 12,193,144 B2
(45) Date of Patent: Jan. 7, 2025

(54) MODULE

(71) Applicant: Murata Manufacturing Co., Ltd., Nagaokakyo (JP)

(72) Inventors: Yukio Yamamoto, Nagaokakyo (JP); Yoshihito Otsubo, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 435 days.

(21) Appl. No.: 17/478,355

(22) Filed: Sep. 17, 2021

(65) Prior Publication Data

US 2022/0007494 A1 Jan. 6, 2022

Related U.S. Application Data

(63) Continuation of application No. PCT/JP2020/013659, filed on Mar. 26, 2020.

(30) Foreign Application Priority Data

Mar. 28, 2019 (JP) ................................. 2019-063682

(51) Int. Cl.
*H05K 1/02* (2006.01)
*H05K 1/11* (2006.01)
*H05K 1/18* (2006.01)

(52) U.S. Cl.
CPC ............ *H05K 1/0204* (2013.01); *H05K 1/115* (2013.01); *H05K 1/185* (2013.01); *H05K 2201/0376* (2013.01)

(58) Field of Classification Search
CPC ...... H05K 1/0204; H05K 1/115; H05K 1/185; H05K 2201/0376

(Continued)

(56) References Cited

U.S. PATENT DOCUMENTS 5,640,048 A * 6/1997 Selna .................. H01L 23/3128
257/E23.079
6,038,133 A * 3/2000 Nakatani ................ H01L 25/16
428/209

(Continued)

FOREIGN PATENT DOCUMENTS

JP 2007235176 A 9/2007
JP 2007317712 A 12/2007

(Continued)

OTHER PUBLICATIONS

JP 2013-179246 A English translation (Year: 2013).*

(Continued)

*Primary Examiner* — Anatoly Vortman
(74) *Attorney, Agent, or Firm* — ArentFox Schiff LLP (57) ABSTRACT

A modules is provided in which an electronic component is disposed on a first main surface and each of a plurality of first connection terminals is disposed on a second main surface. Moreover, a second connection terminal is disposed on the second main surface. When a substrate is viewed in a direction perpendicular to the second main surface, the second connection terminal is larger in area than each of the first connection terminals. When the substrate is viewed in the direction perpendicular to the second main surface, the second connection terminal is disposed on a straight line connecting the first connection terminals. The second connection terminal serves to establish an electrical connection.

20 Claims, 5 Drawing Sheets

(58) Field of Classification Search
USPC .......................................................... 174/250
See application file for complete search history.

(56) References Cited

U.S. PATENT DOCUMENTS

| | | | | |
|---|---|---|---|---|
| 6,057,600 | A * | 5/2000 | Kitazawa | H01L 23/66 |
| | | | | 257/691 |
| 6,350,952 | B1 * | 2/2002 | Gaku | H01L 23/3128 |
| | | | | 257/E23.125 |
| 6,384,344 | B1 * | 5/2002 | Asai | H01R 12/523 |
| | | | | 174/260 |
| 6,714,422 | B2 * | 3/2004 | Okubora | H05K 1/16 |
| | | | | 361/795 |
| 6,807,061 | B1 * | 10/2004 | Harris | H01L 23/3675 |
| | | | | 257/E23.101 |
| 6,873,529 | B2 * | 3/2005 | Ikuta | H05K 1/0206 |
| | | | | 257/E23.101 |
| 6,961,245 | B2 * | 11/2005 | Ikuta | H01L 23/3677 |
| | | | | 257/713 |
| 8,035,224 | B2 * | 10/2011 | Poeppel | H01L 23/62 |
| | | | | 257/E23.141 |
| 8,432,033 | B2 * | 4/2013 | Shinohara | H01L 21/561 |
| | | | | 257/737 |
| 8,847,371 | B2 | 9/2014 | Otsuka et al. | |
| 10,312,193 | B2 * | 6/2019 | Gu | H01L 25/50 |
| 11,444,002 | B2 * | 9/2022 | Lai | H01L 23/4006 |
| 11,646,273 | B2 * | 5/2023 | Otsubo | H01L 25/18 |
| | | | | 257/659 |
| 11,699,670 | B2 * | 7/2023 | Otsubo | H01L 23/5383 |
| | | | | 257/728 |
| 2003/0036020 | A1 * | 2/2003 | Kubota | C04B 41/009 |
| | | | | 430/313 |
| 2007/0049122 | A1 * | 3/2007 | Kimura | H01L 24/97 |
| | | | | 439/637 |
| 2011/0037170 | A1 * | 2/2011 | Shinohara | H01L 21/565 |
| | | | | 257/737 |
| 2013/0200504 | A1 | 8/2013 | Otsuka et al. | |
| 2014/0185256 | A1 * | 7/2014 | Ogawa | H05K 3/4015 |
| | | | | 29/841 |
| 2016/0307814 | A1 | 10/2016 | Kobayashi | |
| 2020/0043866 | A1 * | 2/2020 | Fujii | H01L 25/0652 |
| 2022/0007494 | A1 * | 1/2022 | Yamamoto | H05K 1/185 |
| 2023/0230951 | A1 * | 7/2023 | Otsubo | H01L 23/66 |
| | | | | 257/678 |
| 2023/0253341 | A1 * | 8/2023 | Kitadume | H01L 23/28 |
| | | | | 257/659 |
| 2023/0260929 | A1 * | 8/2023 | Otsubo | H01L 21/56 |
| | | | | 257/659 |

FOREIGN PATENT DOCUMENTS

| | | |
|---|---|---|
| JP | 2008053351 A | 3/2008 |
| JP | 2013179246 A | 9/2013 |
| JP | 2015012250 A | 1/2015 |
| JP | 2016207743 A | 12/2016 |
| JP | 6079480 B2 | 2/2017 |
| JP | 2017183301 A | 10/2017 |
| JP | 2018074059 A | 5/2018 |

OTHER PUBLICATIONS

International Search Report issued in PCT/JP2020/013659, dated Jun. 30, 2020.

Written Opinion of the International Searching Authority issued in PCT/JP2020/013659, dated Jun. 30, 2020.

* cited by examiner

MODULE

CROSS REFERENCE TO RELATED APPLICATIONS

The present application is a continuation of PCT/JP2020/013659 filed Mar. 26, 2020, which claims priority to Japanese Patent Application No. 2019-063682, filed Mar. 28, 2019, the entire contents of each of which are incorporated herein by reference.

TECHNICAL FIELD

The present invention relates to a module.

BACKGROUND

Japanese Patent Laid-Open No. 2015-012250 (hereinafter Patent Document 1") discloses a configuration of a module. The module disclosed therein includes a main substrate, a heat generating component, other components, a first resin layer, a second resin layer, a third resin layer, and a connection conductor. The heat generating component is mounted on one main surface of the main substrate. The other components are mounted on the other main surface of the main substrate. The first resin layer is formed by coating one main surface of the main substrate and the heat generating component with a resin material. The second resin layer is disposed closer to one wall surface of a housing than the first resin layer. The third resin layer is formed by coating the other main surface of the main substrate and the other components with the same resin material as that of the first resin layer. Moreover, the connection conductor is provided on the third resin layer and has: one end connected to the other main surface of the main substrate; and the other end exposed on the surface of the third resin layer and connected to a motherboard.

In a conventional module, a plurality of connection terminals to be connected to a motherboard are provided on a substrate. In recent years, size reduction of such a module has been demanded, and the interval between the connection terminals has been narrowed. However, the narrowed interval between the connection terminals leads to degraded isolation between the connection terminals.

SUMMARY OF THE INVENTION

The exemplary embodiments of the present invention provide a module with improved in electrical characteristics by enhancing isolation between connection terminals.

Accordingly, in a first exemplary aspect of the present invention, a module is provided that includes a substrate, an electronic component, a first sealing resin, a plurality of first connection terminals, a second connection terminal, and a second sealing resin. The substrate has a first main surface and a second main surface that opposes the first main surface. The electronic component is disposed on the first main surface. The first sealing resin is provided on the first main surface and seals the electronic component. Each of the first connection terminals is disposed on the second main surface and the second connection terminal is disposed on the second main surface. Moreover, the second sealing resin is disposed on the second main surface in a state where an end portion of each of the first connection terminals and the second connection terminal is exposed, with the end portion being located opposite to the second main surface. When the substrate is viewed in a direction perpendicular to the second main surface, the second connection terminal is larger in area than each of the first connection terminals. In addition, when the substrate is viewed in the direction perpendicular to the second main surface, the second connection terminal is disposed on a straight line connecting the first connection terminals. The second connection terminal serves to establish an electrical connection.

According to the exemplary aspects of the present invention, a module is provided with improved electrical characteristics by enhancing isolation between the connection terminals.

DETAILED DESCRIPTION OF EMBODIMENTS

In the following, a module according to each of the exemplary embodiments of the present invention will be described with reference to the accompanying drawings. In the following description of the embodiments, the same or corresponding portions in the accompanying drawings are denoted by the same reference characters, and the description thereof will not be repeated.

First Exemplary Embodiment

Figure 1:
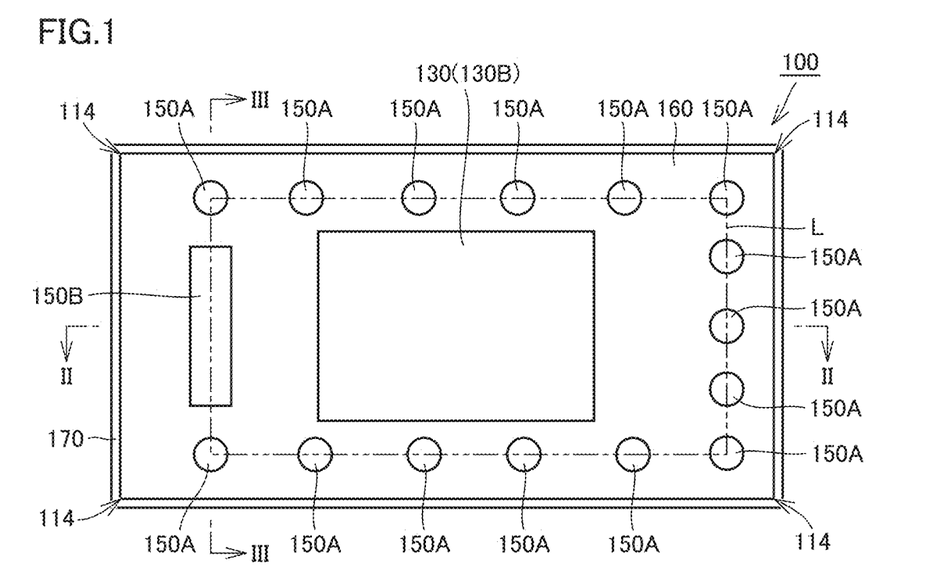
FIG. 1 is a bottom view showing a configuration of a module according to a first exemplary embodiment.
Figure 2:
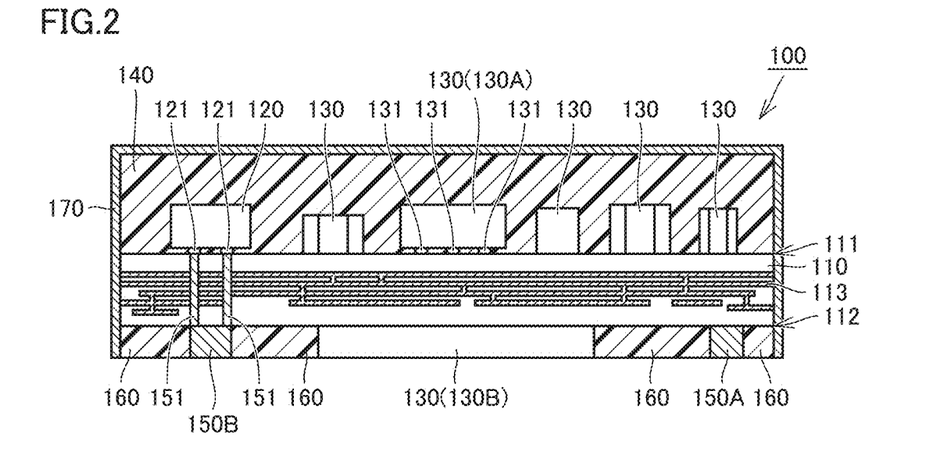
FIG. 2 is a cross-sectional view of the module shown in FIG. 1, as viewed in a direction indicated by an arrow line II-II.
Figure 3:
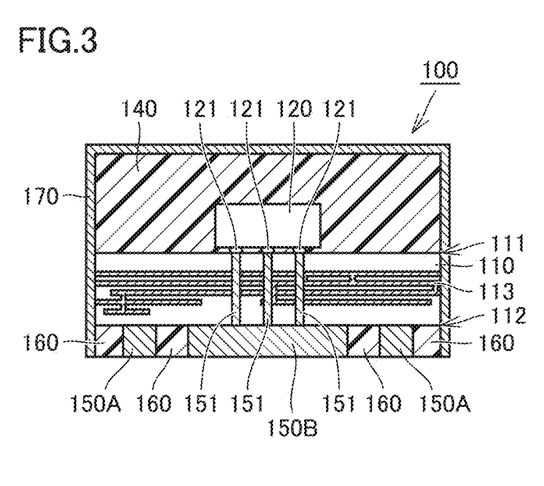
FIG. 3 is a cross-sectional view of the module shown in FIG. 1, as viewed in a direction indicated by an arrow line III-III.

FIG. 1 is a bottom view showing a configuration of a module according to a first exemplary embodiment. FIG. 2 is a cross-sectional view of the module shown in FIG. 1, as viewed in a direction indicated by an arrow line II-II. FIG. 3 is a cross-sectional view of the module shown in FIG. 1, as viewed in a direction indicated by an arrow line III-III.

As shown in FIGS. 1 to 3, a module 100 according to the first exemplary embodiment includes a substrate 110, an electronic component 120, at least one other component 130, a first sealing resin 140, a plurality of first connection terminals 150A, a second connection terminal 150B, and a second sealing resin 160. In an exemplary aspect, the module according to the first exemplary embodiment is mounted, for example, on a motherboard (not shown).

As shown in FIGS. 2 and 3, substrate 110 has a first main surface 111 and a second main surface 112 that faces opposite to (i.e., opposes) first main surface 111. In the present embodiment, substrate 110 is formed of a plurality of layers (not shown). Specifically, substrate 110 is a ceramic multilayer substrate according to an exemplary aspect. Substrate 110 may be a resin multilayer substrate.

Substrate 110 includes a wiring line 113. In the present embodiment, wiring line 113 is a multilayer wiring line. FIGS. 2 and 3 each schematically show the wiring pattern of wiring line 113.

As shown in FIG. 1, in the present embodiment, substrate 110 has a plurality of corner portions 114 when viewed from second main surface 112. Moreover, substrate 110 has a rectangular outer shape when viewed from second main surface 112.

It is noted that the outer shape of substrate 110 when viewed from second main surface 112 is not limited to a rectangular shape. In this case, when substrate 110 is viewed in a direction perpendicular to second main surface 112, each of corner portions 114 may form an acute interior angle of less than 90 degrees or may form an obtuse interior angle of more than 90 degrees and less than 180 degrees.

As shown in FIGS. 2 and 3, electronic component 120 is disposed on first main surface 111. In the present embodiment, electronic component 120 is a heat generating component, such as an IC.

Electronic component 120 has a plurality of connection electrodes 121. Moreover, electronic component 120 is mounted on first main surface 111 of substrate 110 by connection of each connection electrode 121 to substrate 110 with a joining material such as solder. Each connection electrode 121 is made of metal such as Cu, Ag, or Al according to exemplary aspects.

As shown in FIG. 2, at least one other component 130 is disposed on first main surface 111. At least one other component 130 is electrically connected to wiring line 113. At least one other component 130 includes a first other component 130A.

In the present embodiment, first other component 130A is disposed substantially at the center on first main surface 111 of substrate 110. In the present embodiment, the first other component 130A can be a heat generating component such as an IC.

Moreover, the first other component 130A has a plurality of connection electrodes 131. The first other component 130A is mounted on first main surface 111 of substrate 110 by connection of each connection electrode 131 to substrate 110 with a joining material such as solder. Each connection electrode 131 is made of metal such as Cu, Ag, or Al according to exemplary aspects.

Module 100 according to the present embodiment includes a plurality of other components 130. As shown in FIGS. 1 and 2, the plurality of other components 130 further include a second other component 130B disposed on second main surface 112.

In the present embodiment, second other component 130B is disposed substantially at the center on second main surface 112 of substrate 110. Second other component 130B is a heat generating component, such as an IC, for example.

As shown in FIGS. 2 and 3, first sealing resin 140 is provided on first main surface 111 and seals electronic component 120 and at least one other component 130. In the present embodiment, first sealing resin 140 is provided on first main surface 111 and seals electronic component 120 and each of the plurality of other components 130. Specifically, first sealing resin 140 is disposed over the entire surface of substrate 110 except for portions onto which electronic component 120 and the plurality of other components 130 are connected.

According to an exemplary aspect, first sealing resin 140 is made of an epoxy resin, for example. Such an epoxy resin may contain a silica filler or an alumina filler that has relatively high thermal conductivity.

As shown in FIGS. 2 and 3, each of the plurality of first connection terminals 150A is disposed on second main surface 112. Each of the plurality of first connection terminals 150A is electrically connected to at least one component among electronic component 120 and the plurality of other components 130.

In the present embodiment, each of the plurality of first connection terminals 150A may be electrically connected to electronic component 120 through wiring line 113. Each of the plurality of first connection terminals 150A may be electrically connected to one of the plurality of other components 130 through wiring line 113 or through a pillar-shaped conductor (not shown) that penetrates through substrate 110.

Moreover, each of the plurality of first connection terminals 150A is to be connected to a terminal of the motherboard on its end surface opposite to second main surface 112. Each of the plurality of first connection terminals 150A is a signal terminal or a ground terminal. Each of the plurality of first connection terminals 150A may be a power supply terminal.

As shown in FIG. 1, in the present embodiment, each of the plurality of first connection terminals 150A has a circular outer shape when substrate 110 is viewed in a direction perpendicular to second main surface 112. However, it is noted that the outer shape of each of the plurality of first connection terminals 150A is not particularly limited in alternative aspects. When substrate 110 is viewed in the direction perpendicular to second main surface 112, the plurality of first connection terminals 150A are disposed together with second connection terminal 150B on an imaginary line L having a rectangular frame shape so as to surround second other component 130B. For purposes of this disclosure, the term "direction perpendicular to second main surface 112" means, for example, that the shape of the connection terminals 150A are in the same plane as the second main surface 112 with the shape being viewed perpendicularly thereto.

As shown in FIGS. 2 and 3, second connection terminal 150B is disposed on second main surface 112 and electrically connected to electronic component 120. Specifically, second connection terminal 150B is connected to electronic component 120 through a plurality of pillar-shaped conductors 151 provided in substrate 110. Electronic component 120 may be electrically connected to wiring line 113 in addition to the plurality of pillar-shaped conductors 151.

Figure 4:
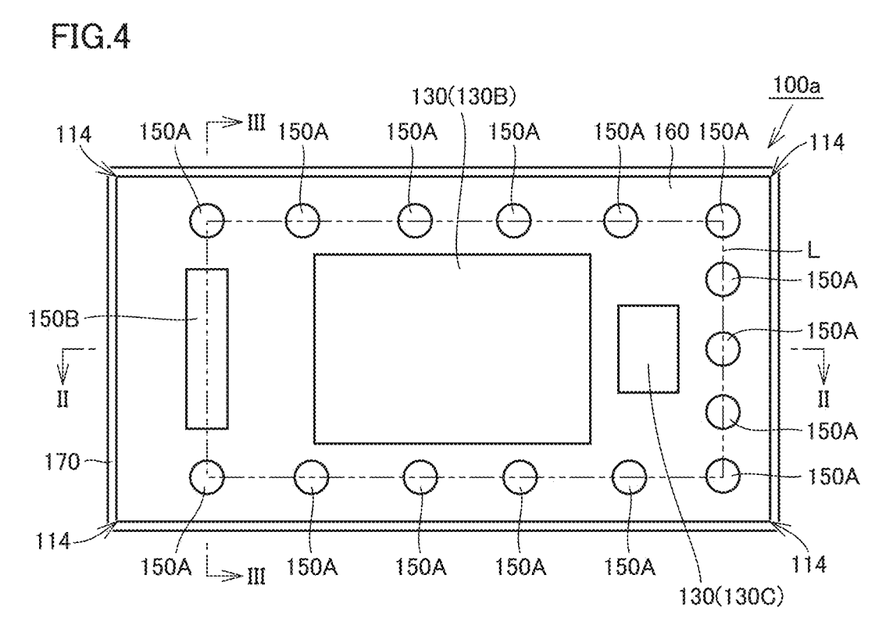
FIG. 4 is a bottom view showing a configuration of a module according to a modification of the first exemplary embodiment.

The module according to the present embodiment may further include a third other component as other component 130. FIG. 4 is a bottom view showing a configuration of a module according to a modification of the first exemplary embodiment. As shown in FIG. 4, a module 100a according to the modification of the present embodiment further includes a third other component 130C. Third other component 130C is disposed on second main surface 112 together with second other component 130B. When substrate 110 is viewed in the direction perpendicular to second main surface 112, the plurality of first connection terminals 150A are disposed together with second connection terminal 150B on an imaginary line L having a rectangular frame shape so as to surround third other component 130C. Other configurations of module 100a according to the modification of the first embodiment of the present invention are the same as those of module 100 according to the first exemplary embodiment.

In module 100 according to the first exemplary embodiment, the plurality of pillar-shaped conductors 151 are arranged in a matrix shape when substrate 110 is viewed in the direction perpendicular to second main surface 112. Each of the plurality of pillar-shaped conductors 151 penetrates through substrate 110 from first main surface 111 to second main surface 112. It is noted that in FIGS. 2 and 3, each of the plurality of pillar-shaped conductors 151 appears to be connected to wiring line 113 in substrate 110, but is actually not directly connected to wiring line 113 in substrate 110.

Moreover, second connection terminal 150B is disposed at a position where second connection terminal 150B overlaps with electronic component 120 when substrate 110 is viewed in the direction perpendicular to second main surface 112.

Second connection terminal 150B is to be connected to a terminal of the motherboard on its end surface opposite to second main surface 112. In the present embodiment, second connection terminal 150B is a ground terminal.

As shown in FIG. 1, in the present embodiment, second connection terminal 150B has a rectangular outer shape when substrate 110 is viewed in the direction perpendicular to second main surface 112. Moreover, when substrate 110 is viewed in the direction perpendicular to second main surface 112, second connection terminal 150B is larger in area than each of the plurality of first connection terminals 150A.

When substrate 110 is viewed in the direction perpendicular to second main surface 112, second connection terminal 150B is disposed on a straight line connecting the plurality of first connection terminals 150A. In other words, second connection terminal 150B is disposed between the plurality of first connection terminals 150A. Second connection terminal 150B is disposed such that its longitudinal direction extends along the above-mentioned imaginary line L having a rectangular frame shape. Each of the plurality of first connection terminals 150A, second connection terminal 150B, and the plurality of pillar-shaped conductors 151 is made of metal such as Cu, Au, Ag, or Al according to exemplary aspects.

In the present embodiment, each of the plurality of first connection terminals 150A and second connection terminal 150B may be formed by mounting a pin made of the above-mentioned metal on second main surface 112 with solder or an electrically conductive adhesive. Each of the plurality of first connection terminals 150A and second connection terminal 150B may be formed by a process in which a via hole formed in second sealing resin 160 is filled with a conductive paste containing the above-mentioned metal or is subjected to via-filling plating. Alternatively, each of the plurality of first connection terminals 150A and second connection terminal 150B may be a protruding electrode.

In the present embodiment, pillar-shaped conductor 151 shown in FIGS. 2 and 3 is formed by connection of via conductors, which are formed in respective layers forming substrate 110, in the direction in which these layers of substrate 110 are stacked. The via conductors each can be formed by a process in which via holes are formed in a plurality of layers constituting substrate 110 with laser beams or the like, and then, are filled with a conductive paste containing the above-mentioned metal or subjected to via-filling plating.

As shown in FIGS. 1 to 3, second sealing resin 160 is provided on second main surface 112 in the state where end portions of first connection terminals 150A, second connection terminal 150B, and second other component 130B are exposed. As shown, these end portions are located opposite to second main surface 112. In the present embodiment, second sealing resin 160 is disposed over the entire surface except for portions onto which first connection terminals 150A, second connection terminal 150B, and second other component 130B are connected.

Second sealing resin 160 is made of an epoxy resin, for example. Such an epoxy resin may contain a silica filler or an alumina filler that has relatively high thermal conductivity.

Module 100 according to the present embodiment further includes a shield layer 170. Shield layer 170 is provided so as to entirely cover the upper surface of first sealing resin 140 and the peripheral side surfaces of first sealing resin 140, substrate 110 and second sealing resin 160. The shield layer is made of metal such as Cu, Ag, or Al according to exemplary aspects.

As described above, in module 100 according to the first exemplary embodiment, when substrate 110 is viewed in the direction perpendicular to second main surface 112 as shown in FIG. 1, second connection terminal 150B is larger in area than each of the plurality of first connection terminals 150A. Further, when substrate 110 is viewed in the direction perpendicular to second main surface 112, second connection terminal 150B is disposed on a straight line connecting the plurality of first connection terminals 150A.

By this configuration of the exemplary aspect, isolation between first connection terminals 150A can be enhanced, so that module 100 has improved electrical characteristics. In particular, when each of the plurality of first connection terminals 150A disposed to sandwich second connection terminal 150B is a signal terminal, second connection terminal 150B is larger in area than first connection terminal 150A when substrate 110 is viewed in the direction perpendicular to second main surface 112. Accordingly, the distance between these signal terminals can be increased, and thus, the isolation characteristics can be further improved.

Further, in module 100 according to the first exemplary embodiment, electronic component 120 is a heat generating component. Second connection terminal 150B is disposed at a position where second connection terminal 150B overlaps with electronic component 120 when substrate 110 is viewed in the direction perpendicular to second main surface 112.

Thereby, module 100 can be reduced in size by the plurality of first connection terminals 150A each having a relatively small area, while allowing second connection terminal 150B having a relatively large area to efficiently dissipate heat generated by electronic component 120.

In the present embodiment, second connection terminal 150B is connected to electronic component 120 through the plurality of pillar-shaped conductors 151 provided in substrate 110. Thereby, the heat generated by electronic component 120 can be efficiently dissipated through the plurality of pillar-shaped conductors 151.

Second Exemplary Embodiment

The following describes a module according to the second exemplary embodiment. The module according to the second exemplary embodiment is different in position of the second connection terminal from module 100 according to the first exemplary embodiment. Thus, the description of the same configurations as those of the module according to the first embodiment will not be repeated.

Figure 5:
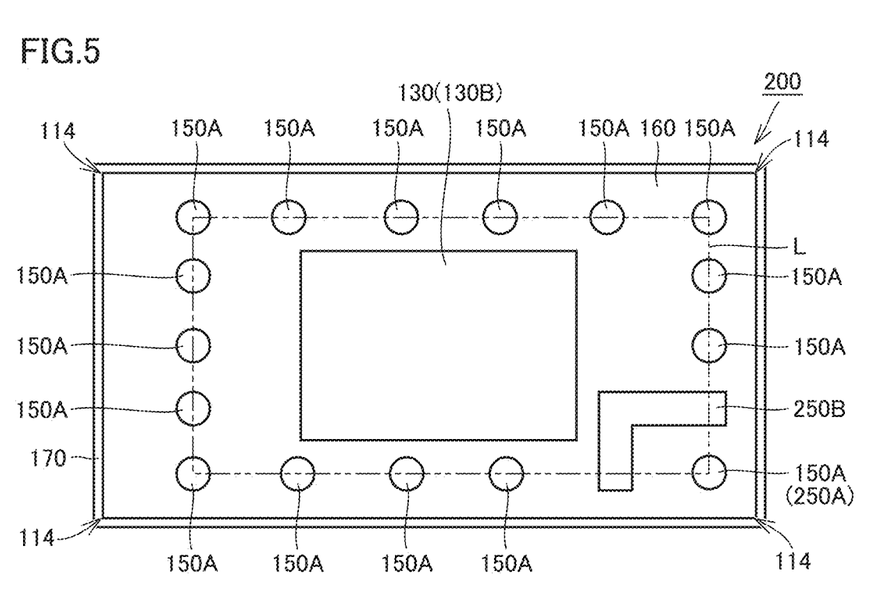
FIG. 5 is a bottom view showing a configuration of a module according to a second exemplary embodiment.

FIG. 5 is a bottom view showing a configuration of the module according to the second exemplary embodiment. As shown in FIG. 5, in a module 200 according to the second embodiment of the present invention, a second connection terminal 250B has an L-shaped outline when substrate 110 is viewed in the direction perpendicular to second main surface 112.

When substrate 110 is viewed in the direction perpendicular to second main surface 112, at least a part of second connection terminal 250B extends to be orthogonal to a straight line connecting the plurality of first connection terminals 150A. This configuration further enhances isolation between first connection terminals 150A.

When substrate 110 is viewed in the direction perpendicular to second main surface 112, second connection terminal 250B is disposed to surround one first connection terminal 250A of the plurality of first connection terminals 150A at least on the inner peripheral side of imaginary line L. This configuration prevents the electric signal at the above-mentioned one first connection terminal 250A from flowing around from the inner peripheral side of imaginary line L and reaching other first connection terminal 150A that faces this one first connection terminal 250A with second connection terminal 250B interposed therebetween. Therefore, isolation between the above-mentioned one first connection terminal 250A and other first connection terminal 150A can be further enhanced. In the present embodiment, the above-mentioned one first connection terminal 250A is disposed near corner portion 114 of substrate 110. Specifically, the above-mentioned one first connection terminal 250A is disposed on a vertex point of a rectangular frame shape represented by imaginary line L.

Third Exemplary Embodiment

The following describes a module according to the third exemplary embodiment. The module according to the third exemplary embodiment is different from module 100 according to the first exemplary embodiment in that it further includes a connection terminal different from first connection terminal 150A and second connection terminal 150B. Thus, the description of the same points as those of module 100 according to the first exemplary embodiment will not be repeated.

Figure 6:
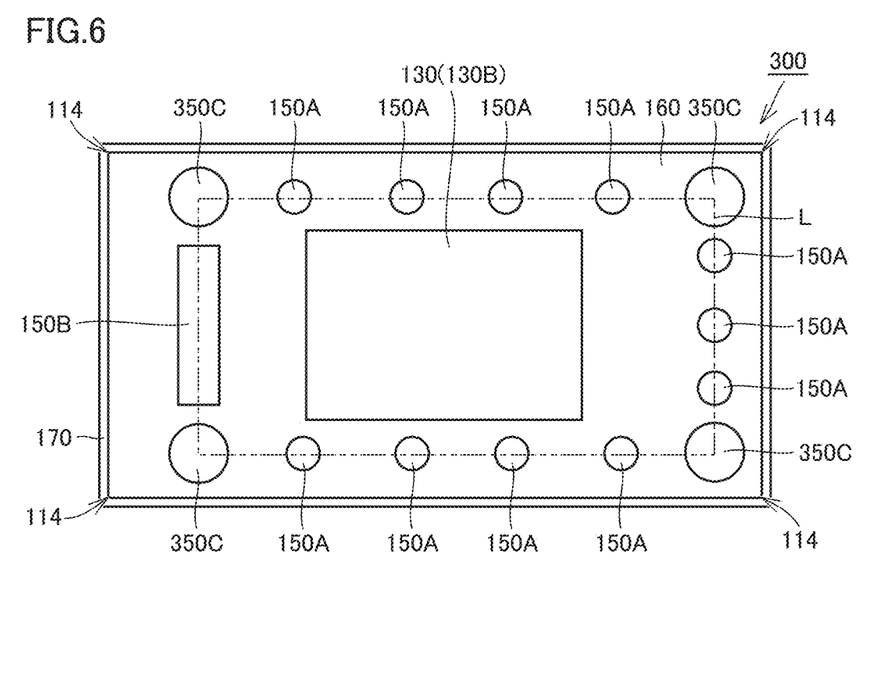
FIG. 6 is a bottom view showing a configuration of a module according to a third exemplary embodiment.

FIG. 6 is a bottom view showing a configuration of a module according to the third exemplary embodiment. As shown in FIG. 6, a module 300 according to the third embodiment of the present invention further includes at least one third connection terminal 350C. In the present embodiment, module 300 includes a plurality of third connection terminals 350C.

At least one third connection terminal 350C is disposed on second main surface 112. At least one third connection terminal 350C is electrically connected to at least one of electronic component 120 and at least one other component 130, in the same manner as with first connection terminal 150A in the first embodiment of the present invention.

In the present embodiment, at least one third connection terminal 350C may be a ground terminal or a power supply terminal according to exemplary aspects.

As shown in FIG. 6, in the present embodiment, at least one third connection terminal 350C has a circular outer shape when viewed from the second main surface of substrate 110. However, it is noted that the outer shape of at least one third connection terminal 350C is not particularly limited according to alternative aspects.

As shown in FIG. 6, when substrate 110 is viewed in the direction perpendicular to second main surface 112, at least one third connection terminal 350C is larger in area than each of the plurality of first connection terminals 150A. In the present embodiment, when substrate 110 is viewed in the direction perpendicular to second main surface 112, at least one third connection terminal 350C is smaller in area than second connection terminal 150B.

Further, at least one third connection terminal 350C is disposed closer to corner portion 114 of substrate 110 than any one of the plurality of first connection terminals 150A and second connection terminal 150B. Specifically, at least one third connection terminal 350C is disposed on a vertex point of a rectangular frame shape represented by imaginary line L. In the present embodiment, four third connection terminals 350C are disposed on respective ones of four vertex points of the rectangular frame shape represented by imaginary line L.

Third connection terminal 350C is made of metal such as Cu, Au, Ag, or Al according to exemplary aspects. Moreover, third connection terminal 350C may be formed by any one of the above-mentioned methods of forming first connection terminal 150A and second connection terminal 150B.

When module 300 is mounted on a motherboard, a significant repeated strain is applied to a joining material such as solder that connects the motherboard and a connection terminal among the connection terminals provided on second main surface 112 that is provided near corner portion 114 of substrate 110. In the present embodiment, third connection terminal 350C located near the corner portion has a relatively large area, which can suppress reliability decrease in the joint with the motherboard due to fatigue failure of the joining material caused by the above-mentioned repeated strain. In addition, by the plurality of first connection terminals 150A each having a relatively small area, module 300 can be reduced in size.

Fourth Exemplary Embodiment

The following describes a module according to the fourth exemplary embodiment. The module according to the fourth exemplary embodiment is different from module 100 according to the first exemplary embodiment in that it further includes a connection terminal different from first connection terminal 150A and second connection terminal 150B. Thus, the description of the same points as those of module 100 according to the first exemplary embodiment will not be repeated.

Figure 7:
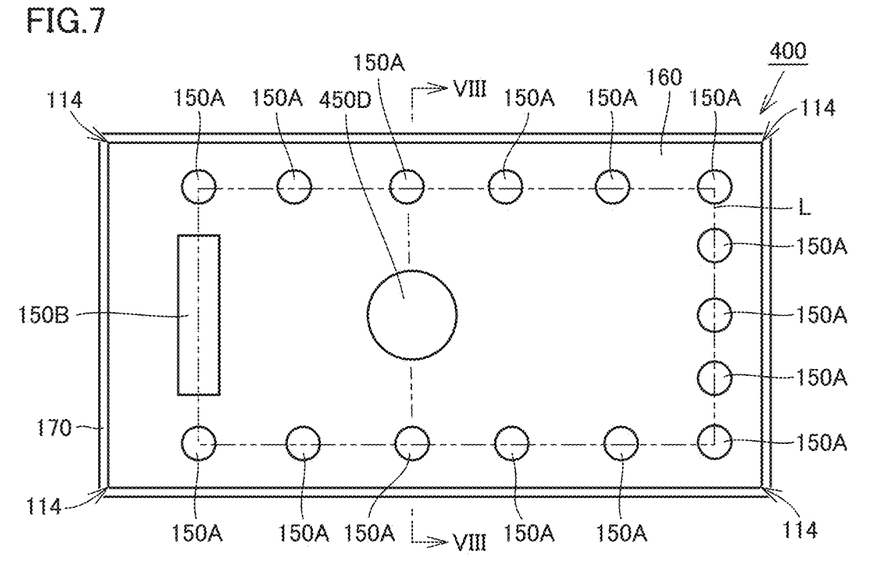
FIG. 7 is a bottom view showing a configuration of a module according to a fourth exemplary embodiment.
Figure 8:
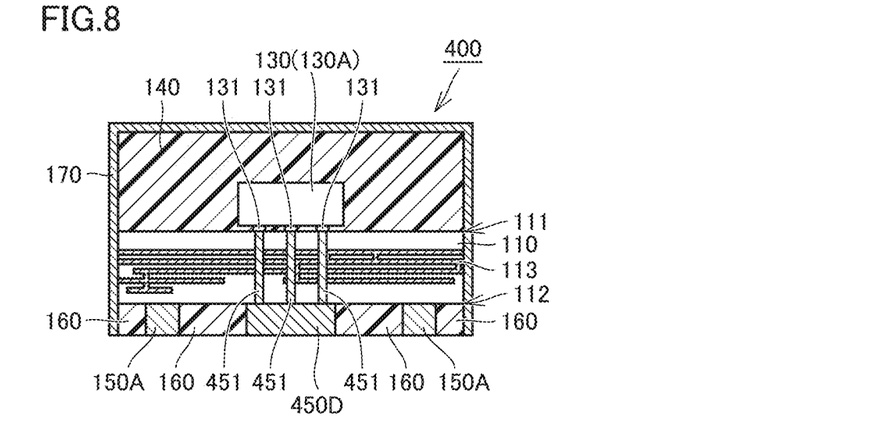
FIG. 8 is a cross-sectional view of the module shown in FIG. 7, as viewed in a direction indicated by an arrow line VIII-VIII.

FIG. 7 is a bottom view showing a configuration of a module according to the fourth embodiment of the present invention. FIG. 8 is a cross-sectional view of the module shown in FIG. 7, as viewed in a direction indicated by an arrow line VIII-VIII.

As shown in FIGS. 7 and 8, a module 400 according to the fourth exemplary embodiment further includes a fourth connection terminal 450D. In the fourth embodiment of the present invention, second other component 130B in the first exemplary embodiment shown in FIGS. 1 and 2 is not provided.

As shown in FIG. 8, fourth connection terminal 450D is disposed on second main surface 112 of substrate 110 and electrically connected to first other component 130A. Specifically, fourth connection terminal 450D is connected to first other component 130A through a plurality of pillar-shaped conductors 451.

The plurality of pillar-shaped conductors 451 are arranged in a matrix shape when substrate 110 is viewed in the direction perpendicular to second main surface 112. Each of the plurality of pillar-shaped conductors 451 penetrates through substrate 110 from first main surface 111 to second main surface 112. Each of the plurality of pillar-shaped conductors 451 is not directly connected to wiring line 113 in substrate 110.

Moreover, fourth connection terminal 450D is disposed at a position where it overlaps with first other component 130A when substrate 110 is viewed in the direction perpendicular to second main surface 112.

Fourth connection terminal 450D is to be connected to the terminal of the motherboard on the side opposite to second main surface 112. In the present embodiment, fourth connection terminal 450D may be a ground terminal or a power supply terminal according to exemplary aspects.

As shown in FIG. 7, in the present embodiment, fourth connection terminal 450D has a circular outer shape when substrate 110 is viewed in the direction perpendicular to second main surface 112. However, it is noted that the outer shape of fourth connection terminal 450D is not limited to a circular shape. When substrate 110 is viewed in the direction perpendicular to second main surface 112, fourth connection terminal 450D is larger in area than each of the plurality of first connection terminals 150A.

When substrate 110 is viewed in the direction perpendicular to second main surface 112, fourth connection terminal 450D is disposed on a straight line connecting the plurality of first connection terminals 150A. Fourth connection terminal 450D is disposed substantially at the center on second main surface 112 of substrate 110. Fourth connection terminal 450D is disposed on the inner peripheral side of the above-mentioned imaginary line L having a rectangular frame shape.

Fourth connection terminal 450D is made of metal such as Cu, Au, Ag, or Al according to exemplary aspects. Moreover, it is noted that fourth connection terminal 450D may be formed by any one of the above-described methods of forming first connection terminals 150A and second connection terminal 150B.

In the present embodiment, fourth connection terminal 450D is disposed on a straight line connecting the plurality of first connection terminals 150A. Thus, fourth connection terminal 450D can also enhance isolation between the terminals, so that module 400 can be further improved in electrical characteristics.

In general, it should be appreciated that the above description of the embodiments, the configurations that can be combined may be combined with each other. It should also be understood that the embodiments disclosed herein are illustrative and non-restrictive in every respect.

REFERENCE SIGNS LIST 100, 100a, 200, 300, 400 module, 110 substrate, 111 first main surface, 112 second main surface, 113 wiring line, 114 corner portion, 120 electronic component, 121, 131 connection electrode, 130 other component, 130A first other component, 130B second other component, 130C third other component, 140 first sealing resin, 150A, 250A first connection terminal, 150B, 250B second connection terminal, 151, 451 pillar-shaped conductor, 160 second sealing resin, 170 shield layer, 350C third connection terminal, 450D fourth connection terminal.

The invention claimed is:

1. A module comprising:
    a substrate having a first main surface and a second main surface that opposes the first main surface;
    an electronic component disposed on the first main surface;
    a first sealing resin disposed on the first main surface to seal the electronic component;
    a plurality of first connection terminals disposed on the second main surface;
    a second connection terminal disposed on the second main surface; and
    a second sealing resin disposed on the second main surface, such that an end portion of each of the first connection terminals and the second connection terminal is exposed, with each respective end portion being located opposite to the second main surface,
    wherein the second connection terminal has an area larger than an area of each of the first connection terminals when the substrate is viewed in a direction perpendicular to the second main surface, and
    wherein the second connection terminal is disposed on a straight line that connects the respective first connection terminals when the substrate is viewed in the direction perpendicular to the second main surface,
    wherein the second connection terminal establishes is configured to establish an electrical connection between the electronic component and a terminal of a motherboard when the module is mounted thereto, and
    wherein the second connection terminal does not overlap each of the plurality of first connection terminals on the second main surface in the direction perpendicular to the second main surface.

2. The module according to claim 1, wherein the second connection terminal is a ground terminal.

3. The module according to claim 1, wherein the electronic component is a heat generating component, and when the substrate is viewed in the direction perpendicular to the second main surface, the second connection terminal is disposed at a position to overlap the electronic component.

4. The module according to claim 1, wherein the second connection terminal surrounds one of the first connection terminals when the substrate is viewed in the direction perpendicular to the second main surface.

5. The module according to claim 1, further comprising at least one third connection terminal disposed on the second main surface.

6. The module according to claim 5, wherein the at least one third connection terminal has an area larger than the area of each of the first connection terminals when the substrate is viewed in the direction perpendicular to the second main surface.

7. The module according to claim 6, wherein the at least one third connection terminal is disposed closer to a corner of the substrate than each of the first connection terminals and the second connection terminal.

8. The module according to claim 7, wherein the second main surface of the substrate has a rectangular frame shape when the substrate is viewed in the direction perpendicular to the second main surface.

9. The module according to claim 8, wherein the at least one third connection terminal comprises four third connection terminals disposed on respective vertex points of four vertex points of the rectangular frame shape of the second main surface of the substrate.

10. The module according to claim 1, wherein the second connection terminal is connected to the electronic component through a plurality of pillar-shaped conductors extending through the substrate.

11. The module according to claim 1, wherein each of the first connection terminals and the second connection terminal are protruding electrodes that extend away from the second main surface of the substrate.

12. The module according to claim 1, further comprising a shield layer that entirely covers an upper surface of first sealing resin, peripheral side surfaces of first sealing resin, the substrate and the second sealing resin.

13. The module according to claim 1, wherein the second connection terminal has an L-shaped outline when the substrate is viewed in the direction perpendicular to second main surface of the substrate.

14. The module according to claim 1, further comprising at least one additional electronic component disposed on the first main surface of the substrate.

15. The module according to claim 14, wherein the substrate comprises a multilayer wiring line that is electrically connected to the at least one additional electronic component.

16. A module comprising:
- a substrate having a first main surface and a second main surface that opposes the first main surface;
- an electronic component disposed on the first main surface;
- a plurality of first connection terminals disposed on the second main surface;
- a second connection terminal disposed on the second main surface and establishes an electrical connection between the electronic component and a terminal of a motherboard when the module is mounted thereto; and
- a sealing resin disposed on the second main surface that exposes each of the first connection terminals and the second connection terminal from the module and opposite to the second main surface of the substrate,
- wherein the second connection terminal has surface area opposite the second main surface that is larger than a surface area of each of the first connection terminals opposite the second main surface, and
- wherein the second connection terminal does not overlap each of the plurality of first connection terminals on the second main surface in a direction perpendicular to the second main surface.

17. The module according to claim 16, wherein the second connection terminal is disposed on a straight line that connects respective end portions of the first connection terminals.

18. The module according to claim 16, wherein the electronic component is a heat generating component, and when the substrate is viewed in the direction perpendicular to the second main surface, the second connection terminal is disposed at a position that overlaps the electronic component.

19. The module according to claim 16, wherein the second connection terminal surrounds one of the first connection terminals when the substrate is viewed in the direction perpendicular to the second main surface.

20. The module according to claim 16, further comprising:
- at least one third connection terminal disposed on the second main surface,
- wherein the at least one third connection terminal has a surface area opposite the second main surface that is larger than the surface area of each of the first connection terminals, and
- wherein the at least one third connection terminal is disposed closer to a corner of the substrate than each of the first connection terminals and the second connection terminal.

\* \* \* \* \*